(12) United States Patent
Zhang et al.

(10) Patent No.: US 12,184,291 B1
(45) Date of Patent: Dec. 31, 2024

(54) PHASE-LOCKED LOOP CIRCUIT WITH FREQUENCY HOLDING AND REFERENCE FREQUENCY SMOOTH SWITCHING

(71) Applicant: MAGNICHIP CO., LTD, Nanjing (CN)

(72) Inventors: Hao Zhang, Nanjing (CN); Chao Zhao, Nanjing (CN)

(73) Assignee: MAGNICHIP CO., LTD, Nanjing (CN)

( * ) Notice: Subject to any disclaimer, the term of this patent is extended or adjusted under 35 U.S.C. 154(b) by 0 days.

(21) Appl. No.: 18/822,556

(22) Filed: Sep. 3, 2024

Related U.S. Application Data

(63) Continuation of application No. PCT/CN2023/128426, filed on Oct. 31, 2023.

(30) Foreign Application Priority Data

Apr. 26, 2023  (CN) .......................... 202310458100.8

(51) Int. Cl.
| | |
|---|---|
| *H03L 7/089* | (2006.01) |
| *H03L 7/093* | (2006.01) |
| *H03L 7/099* | (2006.01) |

(52) U.S. Cl.
CPC ............ *H03L 7/0891* (2013.01); *H03L 7/093* (2013.01); *H03L 7/099* (2013.01)

(58) Field of Classification Search
CPC ........ H03L 7/0891; H03L 7/093; H03L 7/099
See application file for complete search history.

(56) References Cited

U.S. PATENT DOCUMENTS

| | | | | |
|---|---|---|---|---|
| 5,740,211 A | * | 4/1998 | Bedrosian | .......... H04Q 11/0478 327/147 |
| 6,741,109 B1 | * | 5/2004 | Huang | .................... H03L 7/081 327/156 |
| 7,590,387 B2 | * | 9/2009 | Chien | .................... H03L 7/099 455/67.11 |

(Continued)

FOREIGN PATENT DOCUMENTS

| | | | |
|---|---|---|---|
| CN | 101079630 A | | 11/2007 |
| CN | 103346790 A | * | 10/2013 |

(Continued)

*Primary Examiner* — Adam D Houston
(74) *Attorney, Agent, or Firm* — CBM PATENT CONSULTING, LLC

(57) ABSTRACT

A phase-locked loop circuit comprises a clock signal loss detection module, a time-to-digital converter, a digital-to-time converter, a phase discriminator, a charge pump, a loop filter, a comparator, a voltage-controlled oscillator, a frequency divider, a reference voltage generation module and a switch; a capacitor array of the voltage-controlled oscillator is adjusted by using an output of the comparator, so that a control voltage Vctrl of the voltage-controlled oscillator is constantly equal to a reference voltage after a phase-locked loop is locked and does not change along with a change of a PVT condition; after a reference clock signal is lost, the circuit directly adopts the reference voltage as the control voltage of the voltage-controlled oscillator, and after the reference clock signal is re-accessed, an output delay of the digital-to-time converter is adjusted, clock edge alignment of a new reference clock signal and a feedback clock signal is realized.

3 Claims, 5 Drawing Sheets

(56) References Cited

U.S. PATENT DOCUMENTS

| | | | |
|---|---|---|---|
| 8,547,317 B2 * | 10/2013 | Lee | H03L 7/185 |
| | | | 345/204 |
| 10,326,458 B2 * | 6/2019 | Liang | H03L 7/104 |
| 11,870,450 B1 * | 1/2024 | Cheng | H03L 7/0995 |
| 2005/0110589 A1 * | 5/2005 | Loke | H03L 7/099 |
| | | | 331/177 V |
| 2006/0038620 A1 * | 2/2006 | Drapkin | H03L 7/0891 |
| | | | 331/16 |
| 2007/0247248 A1 | 10/2007 | Kobayashi et al. | |
| 2011/0148485 A1 * | 6/2011 | Cho | H03L 7/0995 |
| | | | 327/157 |
| 2018/0145696 A1 * | 5/2018 | Sarda | H03L 7/093 |
| 2018/0329450 A1 * | 11/2018 | Jin | G06F 1/12 |
| 2021/0013375 A1 | 1/2021 | Wu | |

FOREIGN PATENT DOCUMENTS

| | | | |
|---|---|---|---|
| CN | 104506190 A | | 4/2015 |
| CN | 107634761 A | | 1/2018 |
| CN | 110350912 A | | 10/2019 |
| CN | 110719100 A | | 1/2020 |
| CN | 112217512 A | | 1/2021 |
| CN | 112653454 A | | 4/2021 |
| CN | 112994687 A | | 6/2021 |
| CN | 114513204 A | | 5/2022 |
| CN | 115378429 A | | 11/2022 |
| CN | 115459766 A | | 12/2022 |
| CN | 116170012 A | * | 5/2023 |
| CN | 116260456 A | * | 6/2023 |
| CN | 116488644 A | * | 7/2023 |
| CN | 116566387 A | * | 8/2023 |

* cited by examiner

PHASE-LOCKED LOOP CIRCUIT WITH FREQUENCY HOLDING AND REFERENCE FREQUENCY SMOOTH SWITCHING

CROSS-REFERENCE TO RELATED APPLICATIONS

This application is the U.S. continuation application of International Application No. PCT/CN2023/128426 filed on 31 Oct. 2023 which designated the U.S. and claims priority to Chinese Application No. CN202310458100.8 filed on 26 Apr. 2023, the entire contents of each of which are hereby incorporated by reference.

TECHNICAL FIELD

The present invention relates to the field of semiconductor integrated circuits, and particularly to a phase-locked loop circuit with frequency holding and reference frequency smooth switching.

BACKGROUND

Phase-locked loop circuit is widely used in various chips and is an indispensable part of a radio-frequency circuit. A performance of outputting a clock signal of the phase-locked loop circuit determines a performance of a whole radio-frequency system. In practical application, the loss of a reference clock signal is inevitable. When the reference clock signal is lost, an output frequency of a traditional phase-locked loop circuit will change greatly, which affects the stability of a loop. At present, in an existing solution, when the reference clock signal is lost, a value of a control voltage Vcrtl of a voltage-controlled oscillator is detected by using a digital-to-analog converter, and then the control voltage of the voltage-controlled oscillator is adjusted by using an analog-to-digital converter, so as to keep the control voltage stable. However, due to a large delay between the digital-to-analog converter and the analog-to-digital converter, the value of the control voltage Vcrtl will still jump in practical engineering application, which affects an output frequency of a phase-locked loop.

In addition, when the reference clock signal is re-accessed, the traditional phase-locked loop circuit needs to spend a long time on re-locking. In this process, the output frequency of the phase-locked loop will change constantly, which greatly affects a working state of the circuit, leading to the decline of the performance or the incapability of normal operation of the circuit system. Therefore, how to design the phase-locked loop reasonably to avoid the change of the output frequency of the phase-locked loop caused by the loss and re-access of the reference clock signal has become an urgent problem to be solved.

SUMMARY

The present invention aims to solve the defects in the prior art, and to provide a phase-locked loop circuit with frequency holding and reference frequency smooth switching, wherein a capacitor array of the voltage-controlled oscillator is adjusted by using an output of the comparator, so that a control voltage Vctrl of the voltage-controlled oscillator is constantly equal to a reference voltage Vref after a phase-locked loop is locked and does not change along with a change of a PVT condition. After a reference clock signal is lost, the circuit directly uses the Vref as the control voltage of the voltage-controlled oscillator, which effectively solves the problem of jumping of an output frequency caused by the loss of the reference clock signal. On the other hand, the circuit adopts a time-to-digital converter and a digital-to-time converter, and after the reference clock signal is re-accessed, the time-to-digital converter monitors a phase difference between the reference clock signal and a feedback clock signal, and adjusts an output delay of the digital-to-time converter, so that clock edge alignment of a new reference clock signal and the feedback clock signal is realized within one or two cycles of the re-access of the reference clock signal. When the time-to-digital converter monitors that the phase difference between the new reference clock signal and the feedback clock signal is very small, a phase discriminator/charge pump loop is switched to work. According to the circuit, after the reference clock signal is re-accessed, a re-locking process is not needed, the fluctuation of the output frequency is greatly reduced, and the stability of the loop is improved. Whether the reference clock signal is lost or re-accessed, the output frequency of the circuit keeps stable.

In order to achieve the object above, the present invention provides the following technical solution: a phase-locked loop circuit with frequency holding and reference frequency smooth switching comprises: a clock signal processing module, and a phase-locked loop function module and a Vcrtl voltage control module which are respectively connected with the clock signal processing module, wherein the phase-locked loop function module is connected with the Vcrtl voltage control module.

The clock signal processing module is configured for receiving and monitoring an external reference clock signal CLKref in real time, and simultaneously generating a feedback clock signal CLKfb; and according to a phase difference between the reference clock signal CLKref and the feedback clock signal CLKfb, the phase-locked loop function module and the Vcrtl voltage control module connected with the clock signal processing module are controlled by outputting a pulse signal, and a controlled reference clock signal is provided for a subsequent circuit connected with the phase-locked loop circuit.

Further, the clock signal processing module above comprises a clock signal loss detection module (10), a digital-to-time converter (11) and a time-to-digital converter (12).

an input end (101) of the clock signal loss detection module (10) and an input end (111) of the digital-to-time converter (11) are respectively used as an input end of the clock signal processing module for receiving the reference clock signal CLKref, and an output end (102) of the clock signal loss detection module (10) is connected with a control end (123) of the time-to-digital converter (12); and the output end (102) of the clock signal loss detection module (10) is used as a first output end of the time signal processing module to be connected with the Vcrtl voltage control module and the phase-locked loop function module respectively. An output end (124) of the time-to-digital converter (12) is connected with a control end (112) of the digital-to-time converter (11) for controlling an output delay of the digital-to-time converter (11). An output end (113) of the digital-to-time converter (11) is used as a second output end of the time signal processing module to be connected with the phase-locked loop function module for outputting a new clock signal CLKNEW with a same frequency as the reference clock signal CLKref and a phase difference controlled by the output delay of the digital-to-time converter (11); and the output end (113) of the digital-to-time converter (11) is connected with a second input end (122) of the time-to-digital converter (12).

A first input end (121) of the time-to-digital converter (12) is used as a feedback signal receiving end of the clock signal processing module, and receives the feedback clock signal CLKfb output by the phase-locked loop function module.

Further, the phase-locked loop function module above comprises a phase discriminator (13), a charge pump (14), a loop filter (15), a voltage-controlled oscillator (16) and a connection frequency divider (17). A first output end (133) of the phase discriminator (13) is connected with a first input end (141) of the charge pump (14) for the phase discriminator (13) to output the new clock signal CLKNEW to the charge pump (14), a second output end (134) of the phase discriminator (13) is connected with a second input end (142) of the charge pump (14) for the phase discriminator (13) to output the feedback clock signal CLKfb to the charge pump (14), and a control signal of the charge pump is generated according to a phase difference between the CLKNEW and the CLKfb at the same time. An output end (143) of the charge pump (14) is used as a first output end of the phase-locked loop function module to be connected with the voltage control module.

The phase discriminator (13) is used as a first input end of the phase-locked loop function module, and receives an output signal of the output end (113) of the digital-to-time converter (11). A control end (144) of the charge pump (14) receives an output signal of the output end (102) of the clock signal loss detection module (10). An input end (151) of the loop filter (15) receives an output signal of the charge pump (14) through the voltage control module; an output end (152) of the loop filter (15) is connected with an input end (161) of the voltage-controlled oscillator (16); an output end (162) of the voltage-controlled oscillator (16) is connected with an input end (171) of the connection frequency divider (17), and an output end (172) of the connection frequency divider (17) is used as a second output end of the phase-locked loop function module to be connected with the first input end (121) of the time-to-digital converter (12); and an output end (162) of the voltage-controlled oscillator (16) is used as an output end of the phase-locked loop function module to provide a controlled reference clock signal for a subsequent circuit connected with a phase-locked loop circuit.

Further, the Vcrtl voltage control module above comprises a comparator (18), a reference voltage generation module (19) and a switch (20). An output end (191) of the reference voltage generation module (19) is connected with a first input end (181) of the comparator (18) for outputting a reference voltage Vref to the comparator (18); and the output end (191) of the reference voltage generation module (19) is connected with a first input end (201) of the switch (20). A second input end (182) of the comparator (18) is connected with a third input end (203) of the switch (20). The switch (20) is used as an input end of the Vcrtl voltage control module, and receives an output signal of the output end (102) of the clock signal loss detection module (10); and a third input end (203) of the switch (20) is connected with the input end (151) of the loop filter (15). An output end (183) of the comparator (18) is used as an output end of the Vcrtl voltage control module to be connected with a capacitor array control end (163) of the voltage-controlled oscillator (16).

Further, the time-to-digital converter (12) is used for phase detection, and adopts a 1 bit binary phase discriminator.

Further, the voltage-controlled oscillator (16) comprises a plurality of adjustable capacitor arrays connected in parallel.

Compared with the prior art, the present invention has the following beneficial effects: the problem of jumping of the output frequency caused by the loss of the reference clock signal in a traditional phase-locked loop circuit and a phase-locked loop circuit adopting AD/DA is solved.

After the reference clock signal is re-accessed, a re-locking process is not needed, the fluctuation of the output frequency is greatly reduced, and the stability of the loop is improved.

DETAILED DESCRIPTION

Figure 1:
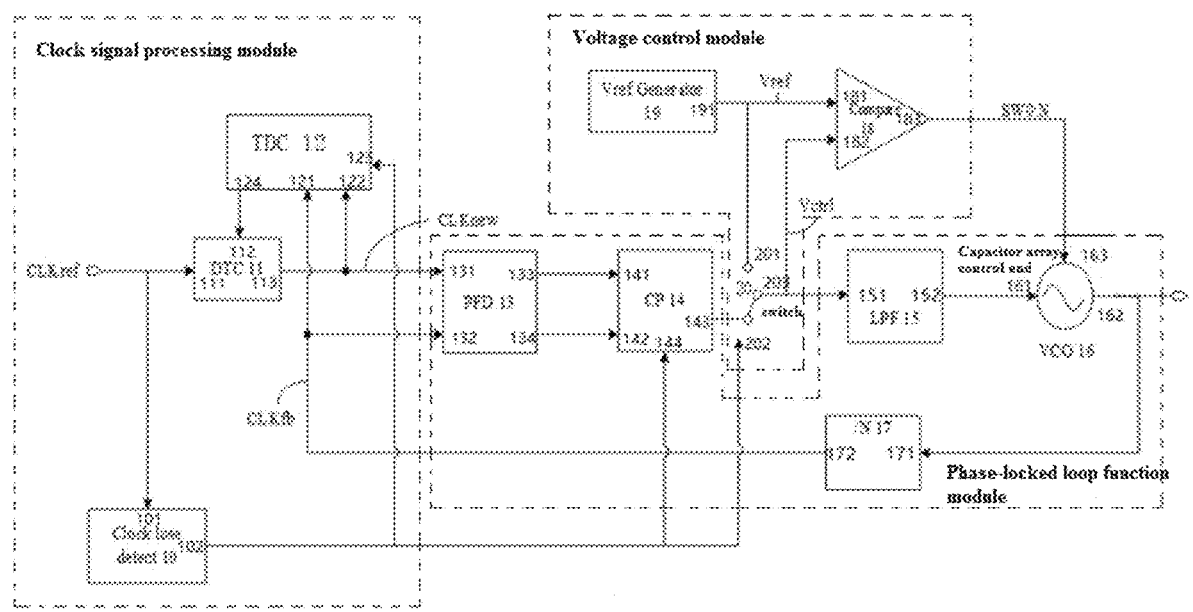
FIG. 1 is a schematic structural diagram of a phase-locked loop circuit in the present invention.

In order to better understand the technical contents of the present invention, specific embodiments are given and illustrated with reference to the drawings as follows.

Various aspects of the present invention are described with reference to the drawings in the present invention, and many illustrative embodiments are shown in the drawings. The embodiments of the present invention are not limited to those described in the drawings.

It should be understood that the present invention is realized by various concepts and embodiments described above and any one of the concepts and embodiments described in detail below, because the concepts and embodiments disclosed in the present invention are not limited to any embodiment. In addition, some aspects disclosed by the present invention may be used separately or in any suitable combination with other aspects disclosed by the present invention.

FIG. 1 shows a schematic structural diagram of a phase-locked loop circuit in the present invention. A phase-locked loop circuit with frequency holding and reference frequency smooth switching comprises: a clock signal processing module, and a phase-locked loop function module and a Vcrtl voltage control module which are respectively connected with the clock signal processing module, wherein the phase-locked loop function module is connected with the Vcrtl voltage control module.

The clock signal processing module is configured for receiving and monitoring an external reference clock signal CLKref in real time, and simultaneously generating a feedback clock signal CLKfb; and according to a phase difference between the external reference clock signal CLKref and the feedback clock signal CLKfb, the phase-locked loop function module and the Vcrtl voltage control module connected with the clock signal processing module are controlled by outputting a pulse signal, and a controlled reference clock signal is provided for a subsequent circuit connected with the phase-locked loop circuit.

The clock signal processing module comprises a clock signal loss detection module Clock lose detect 10, a digital-to-time converter DTC 11 and a time-to-digital converter TDC 12.

An input end 101 of the clock signal loss detection module Clock lose detect 10 and an input end 111 of the digital-to-time converter DTC 11 are respectively used as an input end of the clock signal processing module for receiving the reference clock signal CLKref, and an output end 102 of the clock signal loss detection module Clock lose detect 10 is connected with a control end 123 of the time-to-digital converter TDC 12; and the output end 102 of the clock signal loss detection module Clock lose detect 10 is used as a first output end of the time signal processing module to be connected with the Vcrtl voltage control module and the phase-locked loop function module respectively.

An output end 124 of the time-to-digital converter TDC 12 is connected with a control end 112 of the digital-to-time converter DTC 11 for controlling an output delay of the digital-to-time converter DTC 11.

An output end 113 of the digital-to-time converter DTC 11 is used as a second output end of the time signal processing module to be connected with the phase-locked loop function module for outputting a new clock signal CLKNEW with a same frequency as the reference clock signal CLKref and a phase difference controlled by the output delay of the digital-to-time converter DTC 11; and the output end 113 of the digital-to-time converter DTC 11 is connected with a second input end 122 of the time-to-digital converter TDC 12.

A first input end 121 of the time-to-digital converter TDC 12 is used as a feedback signal receiving end of the clock signal processing module, and receives the feedback clock signal CLKfb output by the phase-locked loop function module.

The phase-locked loop function module comprises a phase discriminator PFD 13, a charge pump CP 14, a loop filter LPF 15, a voltage-controlled oscillator VCO 16 and a connection frequency divider/N 17. A first output end 133 of the phase discriminator PFD 13 is connected with a first input end 141 of the charge pump CP 14 for the phase discriminator PFD 13 to output the new clock signal CLKNEW to the charge pump CP 14, a second output end 134 of the phase discriminator PFD 13 is connected with a second input end 142 of the charge pump CP 14 for the phase discriminator PFD 13 to output the feedback clock signal CLKfb to the charge pump CP 14, and a control signal of the charge pump is generated according to a phase difference between the CLKNEW and the CLKfb at the same time.

An output end 143 of the charge pump CP 14 is used as a first output end of the phase-locked loop function module to be connected with the voltage control module. The phase discriminator PFD 13 is used as a first input end of the phase-locked loop function module, and receives an output signal of the output end 113 of the digital-to-time converter DTC 11. A control end 144 of the charge pump CP 14 receives an output signal of the output end 102 of the clock signal loss detection module Clock lose detect 10. An input end 151 of the loop filter LPF 15 receives an output signal of the charge pump CP 14 through the voltage control module; and an output end 152 of the loop filter LPF 15 is connected with an input end 161 of the voltage-controlled oscillator VCO 16.

Figure 2:
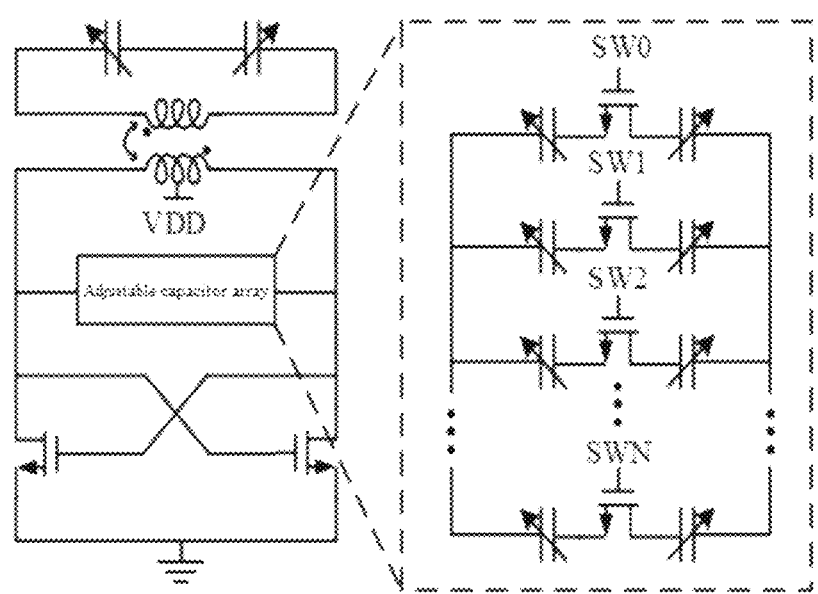
FIG. 2 is a schematic structural diagram of a voltage-controlled oscillator in the present invention.

FIG. 2 shows a schematic diagram of the voltage-controlled oscillator. An output end 162 of the voltage-controlled oscillator VCO 16 is connected with an input end 171 of the connection frequency divider/N 17, and an output end 172 of the connection frequency divider/N 17 is used as a second output end of the phase-locked loop function module to be connected with the first input end 121 of the time-to-digital converter TDC 12; and an output end 162 of the voltage-controlled oscillator VCO 16 is used as an output end of the phase-locked loop function module to provide a controlled reference clock signal for a subsequent circuit connected with a phase-locked loop circuit. The voltage-controlled oscillator VCO 16 comprises a plurality of adjustable capacitor arrays connected in parallel.

The Vcrtl voltage control module comprises a comparator Compare 18, a reference voltage generation module Vref Generator 19 and a switch 20. An output end 191 of the reference voltage generation module Vref Generator 19 is connected with a first input end 181 of the comparator Compare 18 for outputting a reference voltage Vref to the comparator Compare 18.

The output end 191 of the reference voltage generation module Vref Generator 19 is connected with a first input end 201 of the switch 20. A second input end 182 of the comparator Compare 18 is connected with a third input end 203 of the switch 20. The switch 20 is used as an input end of the Vcrtl voltage control module, and receives an output signal of the output end 102 of the clock signal loss detection module Clock lose detect 10; and a third input end 203 of the switch 20 is connected with the input end 151 of the loop filter LPF 15. An output end 183 of the comparator Compare 18 is used as an output end of the Vcrtl voltage control module to be connected with a capacitor array control end 163 of the voltage-controlled oscillator VCO 16.

When the phase-locked loop circuit starts to work, there is specifically the following working process: when the reference clock signal is not lost, the switch 20 is placed at the second input end, the phase-locked loop works normally, the time-to-digital converter TDC 12 does not work, the output delay of the digital-to-time converter DTC 11 is 0, and the output CLKNEW of the digital-to-time converter DTC 11 is the reference clock signal CLKref. The phase discriminator PFD 13 generates the control signal of the charge pump CP 14 according to the phase difference between the reference clock signal CLKref and the feedback clock signal CLKfb, the charge pump CP 14 generates the control voltage Vctrl, and the output frequency of the voltage-controlled oscillator VCO 16 is controlled through the loop filter LPF 15. At the same time, the comparator Compare 18 compares the control voltage Vctrl with the reference voltage Vref, and controls a variable capacitor array accessed to the voltage-controlled oscillator VCO 16 according to a comparison result, so as to change a magnitude of the control voltage Vctrl to make the control voltage Vctrl gradually approach the reference voltage Vref. When the phase-locked loop is locked, the circuit satisfies that an output clock frequency of the voltage-controlled oscillator VCO 16 is locked at N times of the reference clock frequency, and the control voltage Vctrl of the voltage-controlled oscillator VCO 16 is equal to the Vref at the same time and will not change with a change of a PVT condition.

Figure 3:
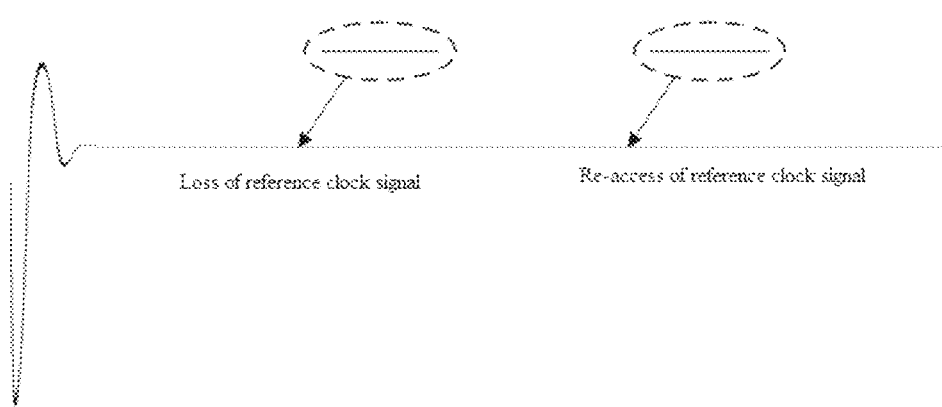
FIG. 3 is an oscillogram of a control voltage Vctrl of the voltage-controlled oscillator in a working process in the present invention.

As shown in FIG. 3, when the reference clock signal is lost, the clock signal loss detection module Clock lose detect 10 outputs a pulse signal, and the control switch 20 is placed at the first input end, that is, the output end of the charge pump CP 14 is disconnected from the input end of the loop filter LPF 15. At this time, the control voltage Vctrl of the voltage-controlled oscillator VCO 16 is no longer influenced by an output of the charge pump CP 14, but is controlled by an output of the reference voltage generation module Vref Generator 19. The time-to-digital converter TDC 12 starts to work, and at the same time, the charge pump CP 14 outputs high resistance. In this case, the control voltage will not jump due to the loss of the reference clock signal, so that the output clock frequency of the voltage-controlled oscillator VCO 16 may keep stable.

Figure 4:
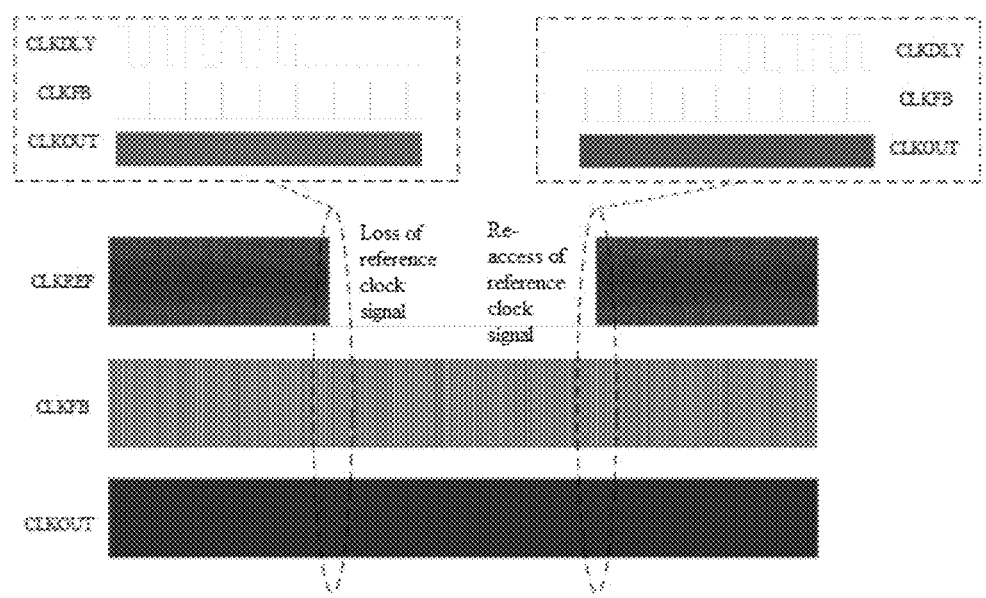
FIG. 4 is an oscillogram of a reference clock and a feedback clock when a reference clock signal is restored in the present invention.
Figure 5:
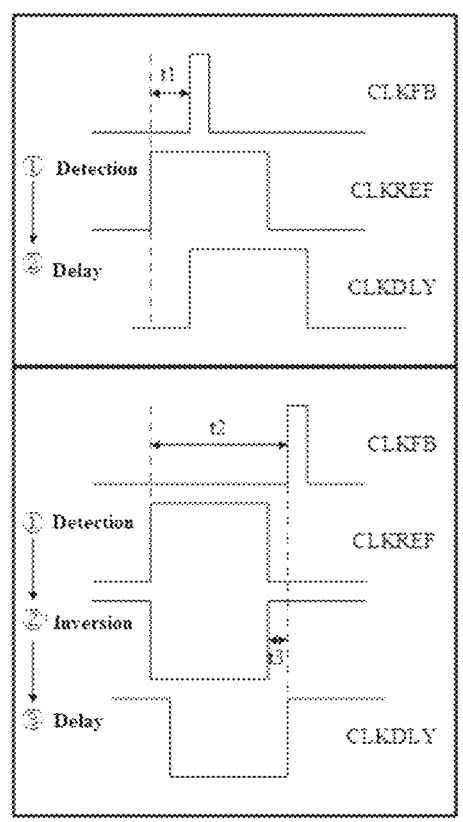
FIG. 5 is an oscillogram of a process of adjusting a new reference clock signal for the reference clock and the feedback clock in the present invention.

FIG. 4 shows an oscillogram of a reference clock and a feedback clock when a reference clock signal is restored. When the reference clock signal is re-accessed, the time-to-digital converter TDC 12 samples rising edges of the reference clock signal CLKref and the feedback clock signal CLKfb in a first cycle of reference clock input, detects the phase difference between the two signals, adjusts the output delay of the digital-to-time converter, and generates the new reference clock signal CLKNEW. An adjustment process is as shown in FIG. 5, and is specifically as follows: in the first case, if a phase difference t1 is less than a half cycle of the reference clock signal CLKref, the output delay of the digital-to-time converter DTC 11 is directly set to be t1. In the second case, if a phase difference t2 is greater than the half cycle of the reference clock signal CLKref, the reference clock signal CLKref is inverted by using the digital-to-time converter DTC 11 first, then a phase difference t3 between the inverted clock signal and the feedback clock signal CLKfb is re-detected, and the output delay of the digital-to-time converter DTC 11 is adjusted to be t3. Finally, the new clock signal CLKNEW output by the digital-to-time converter DTC 11 has the same frequency as the reference clock signal CLKref and the same phase as the feedback clock signal CLKfb. This process can be realized within one or two cycles of the restoration of the reference clock signal CLKref. When the time-to-digital converter TDC 12 monitors that the phase difference between the new reference clock signal CLKNEW and the feedback clock signal CLKfb is very small, a pulse signal is output again, the switch 20 is placed at the second output end, and the phase discriminator PFD 13/charge pump loop CP 14 starts to work normally again.

The biggest advantage of the circuit provided in herein is that, whether the reference clock signal is lost or re-accessed, the output frequency of the circuit keeps stable.

Although the present invention has been described above with reference to the preferred embodiments, the preferred embodiments are not used to limit the present invention. Those of ordinary skills in the technical field to which the present invention belongs can make various modifications and elaborations without departing from the spirit and scope of the present invention. Therefore, the scope of protection of the present invention should be subject to the scope defined by the claims.

What is claimed is:

1. A phase-locked loop circuit with frequency holding and reference frequency smooth switching, comprising: a clock signal processing module, and a phase-locked loop function module and a Vcrtl voltage control module which are respectively connected with the clock signal processing module, wherein the phase-locked loop function module is connected with the Vcrtl voltage control module;

the clock signal processing module is configured for receiving and monitoring an external reference clock signal CLKref in real time, and simultaneously generating a feedback clock signal CLKfb; and according to a phase difference between the external reference clock signal CLKref and the feedback clock signal CLKfb, the phase-locked loop function module and the Vcrtl voltage control module connected with the clock signal processing module are controlled by outputting a pulse signal, and a controlled reference clock signal is provided for a subsequent circuit connected with the phase-locked loop circuit;

the clock signal processing module comprises a clock signal loss detection module (10), a digital-to-time converter (11) and a time-to-digital converter (12);

an input end (101) of the clock signal loss detection module (10) and an input end (111) of the digital-to-time converter (11) are respectively used as an input end of the clock signal processing module for receiving the reference clock signal CLKref;

an output end (102) of the clock signal loss detection module (10) is connected with a control end (123) of the time-to-digital converter (12); and the output end (102) of the clock signal loss detection module (10) is used as a first output end of the time signal processing module to be connected with the Vcrtl voltage control module and the phase-locked loop function module respectively;

an output end (124) of the time-to-digital converter (12) is connected with a control end (112) of the digital-to-time converter (11) for controlling an output delay of the digital-to-time converter (11);

an output end (113) of the digital-to-time converter (11) is used as a second output end of the time signal processing module to be connected with the phase-locked loop function module for outputting a new clock signal CLKNEW with a same frequency as the reference clock signal CLKref and a phase difference controlled by the output delay of the digital-to-time converter (11); and the output end (113) of the digital-to-time converter (11) is connected with a second input end (122) of the time-to-digital converter (12);

a first input end (121) of the time-to-digital converter (12) is used as a feedback signal receiving end of the clock signal processing module, and receives the feedback clock signal CLKfb output by the phase-locked loop function module;

the phase-locked loop function module comprises a phase discriminator (13), a charge pump (14), a loop filter (15), a voltage-controlled oscillator (16) and a connection frequency divider (17);

a first output end (133) of the phase discriminator (13) is connected with a first input end (141) of the charge pump (14) for the phase discriminator (13) to output the new clock signal CLKNEW to the charge pump (14), a second output end (134) of the phase discriminator is connected with a second input end (142) of the charge pump (14) for the phase discriminator (13) to output the feedback clock signal CLKfb to the charge pump (14), and a control signal of the charge pump is generated according to a phase difference between the CLKNEW and the CLKfb at the same time;

an output end (143) of the charge pump (14) is used as a first output end of the phase-locked loop function module to be connected with the voltage control module;

the phase discriminator (13) is used as a first input end of the phase-locked loop function module, and receives an output signal of the output end (113) of the digital-to-time converter (11);

a control end (144) of the charge pump (14) receives an output signal of the output end (102) of the clock signal loss detection module (10);

an input end (151) of the loop filter (15) receives an output signal of the charge pump (14) through the voltage control module; and an output end (152) of the loop filter (15) is connected with an input end (161) of the voltage-controlled oscillator (16);

an output end (162) of the voltage-controlled oscillator (16) is connected with an input end (171) of the connection frequency divider (17), and an output end (172) of the connection frequency divider (17) is used as a second output end of the phase-locked loop function module to be connected with the first input end (121) of the time-to-digital converter (12); and an output end (162) of the voltage-controlled oscillator (16) is used as an output end of the phase-locked loop function module to provide a controlled reference clock signal for a subsequent circuit connected with a phase-locked loop circuit;

the Vcrtl voltage control module comprises a comparator (18), a reference voltage generation module (19) and a switch (20);

an output end (191) of the reference voltage generation module (19) is connected with a first input end (181) of the comparator (18) for outputting a reference voltage Vref to the comparator (18);

the output end (191) of the reference voltage generation module (19) is connected with a first input end (201) of the switch (20);

a second input end (182) of the comparator (18) is connected with a third input end (203) of the switch (20);

the switch (20) is used as an input end of the Vcrtl voltage control module, and receives an output signal of the output end (102) of the clock signal loss detection module (10); and a third input end (203) of the switch (20) is connected with the input end (151) of the loop filter (15); and an output end (183) of the comparator (18) is used as an output end of the Vcrtl voltage control module to be connected with a capacitor array control end (163) of the voltage-controlled oscillator (16).

2. The phase-locked loop circuit with frequency holding and reference frequency smooth switching according to claim 1, wherein the time-to-digital converter (12) is used for phase detection, and adopts a 1-bit binary phase discriminator.

3. The phase-locked loop circuit with frequency holding and reference frequency smooth switching according to claim 1, wherein the voltage-controlled oscillator (16) comprises a plurality of adjustable capacitor arrays connected in parallel.

\* \* \* \* \*